United States Patent
Gopalakrishnan

(10) Patent No.: US 10,496,472 B2
(45) Date of Patent: Dec. 3, 2019

(54) COMBINED XOR BUFFER MEMORY FOR MULTIPLE OPEN BLOCKS OF NON-VOLATILE MEMORY

(71) Applicant: Western Digital Technologies, Inc., San Jose, CA (US)

(72) Inventor: Raghavendra Gopalakrishnan, Bengaluru (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 155 days.

(21) Appl. No.: 15/787,700

(22) Filed: Oct. 18, 2017

(65) Prior Publication Data
US 2019/0114225 A1    Apr. 18, 2019

(51) Int. Cl.
   *G06F 11/10* (2006.01)
   *G11C 29/52* (2006.01)
   *G11C 29/04* (2006.01)

(52) U.S. Cl.
   CPC ........ *G06F 11/1044* (2013.01); *G06F 11/108* (2013.01); *G06F 11/1068* (2013.01); *G11C 29/52* (2013.01); *G11C 2029/0411* (2013.01)

(58) Field of Classification Search
   CPC ............... G06F 11/1044; G06F 11/108; G06F 11/1068; G11C 29/52; G11C 2029/0411
   See application file for complete search history.

(56) References Cited

U.S. PATENT DOCUMENTS

| | | | | |
|---|---|---|---|---|
| 8,977,813 B2* | 3/2015 | Burd | ................... | G06F 11/1028 365/185.33 |
| 2002/0194526 A1* | 12/2002 | Ulrich | ..................... | G06F 3/061 714/6.12 |
| 2013/0304970 A1* | 11/2013 | Parizi | .................... | G06F 3/0611 711/103 |
| 2018/0024897 A1* | 1/2018 | Cai | ...................... | G06F 11/1666 714/6.12 |
| 2018/0294823 A1* | 10/2018 | Li | ...................... | H03M 13/2906 |
| 2018/0300081 A1* | 10/2018 | Parker | ................. | G06F 12/0246 |
| 2018/0373431 A1* | 12/2018 | Kathawala | .............. | G06F 3/064 |

OTHER PUBLICATIONS

J. Kim, J. Lee, J. Choi, D. Lee and S. H. Noh, "Improving SSD reliability with RAID via Elastic Striping and Anywhere Parity," 2013 43rd Annual IEEE/IFIP International Conference on Dependable Systems and Networks (DSN), Budapest, 2013, pp. 1-12. (Year: 2013).*

* cited by examiner

*Primary Examiner* — Cynthia Britt
(74) *Attorney, Agent, or Firm* — Kunzler Bean & Adamson, PC

(57) ABSTRACT

Apparatuses, systems, methods, and computer program products are disclosed for using a combined parity buffer memory for multiple open blocks of non-volatile memory. A controller is configured to accumulate, to a memory buffer, combined parity data for multiple open blocks of non-volatile memory in response to write operations to the multiple open blocks of non-volatile memory. A controller is configured to determine to close one block of multiple open blocks of non-volatile memory. A controller is configured to generate non-combined parity data for a block of non-volatile memory based on write operations to multiple open blocks of non-volatile memory.

20 Claims, 11 Drawing Sheets

FIG. 2

COMBINED XOR BUFFER MEMORY FOR MULTIPLE OPEN BLOCKS OF NON-VOLATILE MEMORY

TECHNICAL FIELD

The present disclosure, in various embodiments, relates to non-volatile memory and more particularly relates to a combined parity memory for multiple open blocks of non-volatile memory.

BACKGROUND

The amount of data accessed by host computers has steadily continued to grow. Accordingly, storage densities have increased to accommodate greater storage capacities.

However, higher storage densities can increase data errors, making error correction even more important. Buffer memories and other hardware used for error correction may consume a significant amount of area and power, increasing costs and reducing efficiency.

SUMMARY

Apparatuses for using combined parity buffer memory for multiple open blocks of non-volatile memory are disclosed. In at least one embodiment, an apparatus includes a controller for non-volatile memory of a memory device. In some embodiments, a controller is configured to accumulate, in a memory buffer, combined parity data for multiple open blocks of non-volatile memory in response to write operations for the multiple open blocks of non-volatile memory. In some embodiments, a controller is configured to determine to close one block of multiple open blocks of non-volatile memory. A controller, in certain embodiments, is configured to generate non-combined parity data for one block of multiple open blocks based on write operations to the multiple open blocks of non-volatile memory.

Methods for using combined parity buffer memory for multiple open blocks of non-volatile memory are disclosed. In at least one embodiment, a method includes combining, in an XOR buffer memory, parity data for multiple open blocks of non-volatile memory in response to write operations to the multiple open blocks of non-volatile memory. In a further embodiment, a method includes selecting one block of multiple open blocks of non-volatile memory for closing in response to the one block being fully written except for a parity section. A method, in one embodiment, includes extracting non-combined parity data for one block from combined parity data for multiple open blocks. In certain embodiments, a method includes storing non-combined parity data in a parity section of one block to close the one block.

Additional apparatuses for using combined parity buffer memory for multiple open blocks of non-volatile memory are disclosed. In at least one embodiment, an apparatus includes means for combining, in a single buffer, parity data for multiple open blocks of non-volatile memory in response to write operations for the multiple open blocks of non-volatile memory. In one embodiment, an apparatus includes means for generating non-combined parity data for one block of multiple open blocks using combined parity data for the multiple open blocks. An apparatus, in certain embodiments, includes means for closing one block by writing non-combined parity data to the one block.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 2 is a schematic block diagram illustrating a block of non-volatile having a parity section that can be written when the controller determines to close the block;

DETAILED DESCRIPTION

Figure 1:
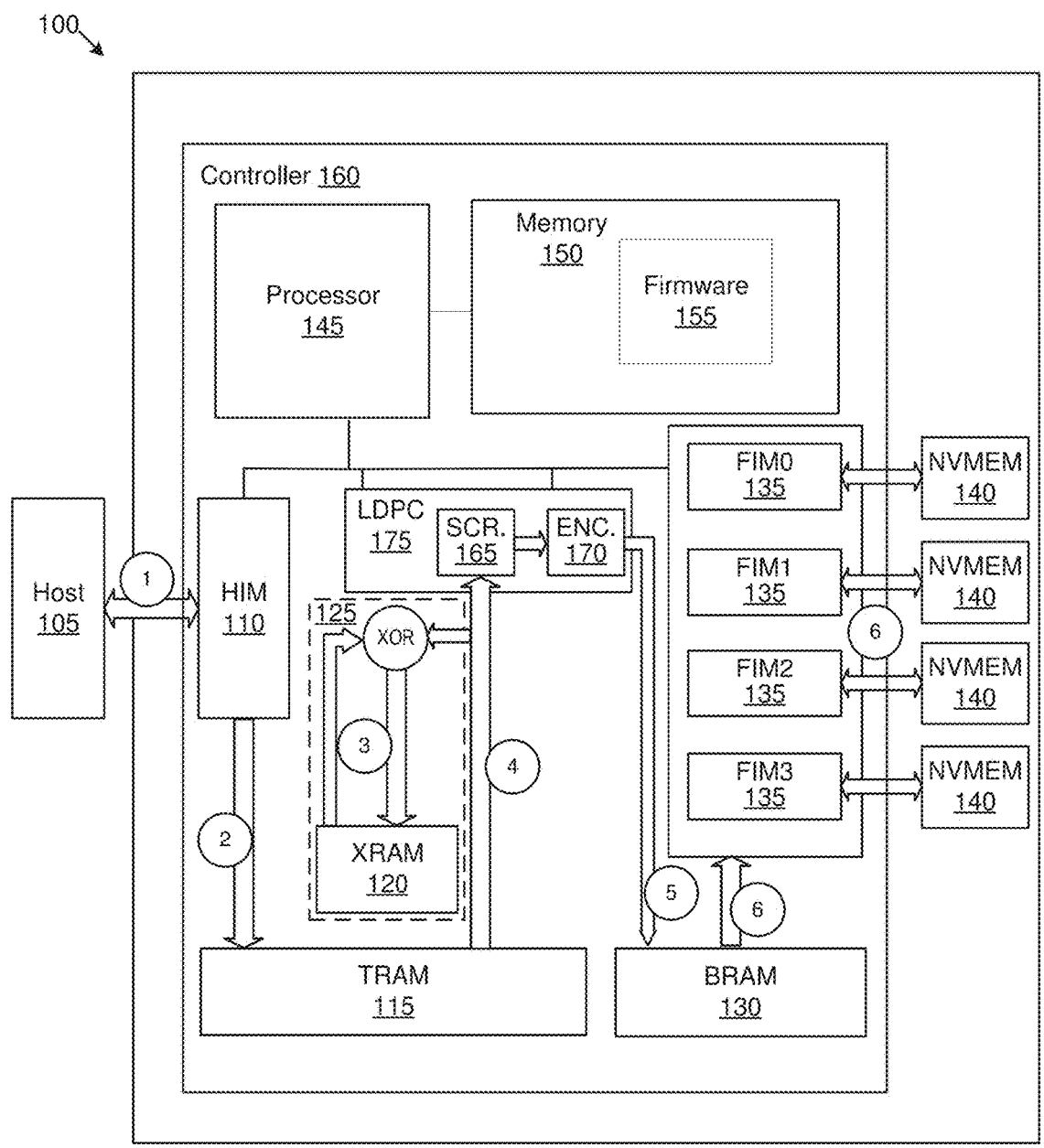
FIG. 1 illustrates one embodiment of a memory device that includes a controller with an XOR engine and XOR buffer memory.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "engine", "module," "apparatus," or "system." Furthermore, aspects of the present disclosure may take the form of a computer program product embodied in one or more non-transitory computer readable storage media storing computer readable and/or executable program code.

Some of the functional units described in this specification have been labeled as modules or engines, in order to more particularly emphasize their implementation independence. For example, a module or an engine may be implemented as a hardware circuit comprising custom VLSI circuits or gate arrays, off-the-shelf semiconductors such as logic chips, transistors, or other discrete components. A module or engine may also be implemented in programmable hardware devices such as field programmable gate arrays, programmable array logic, programmable logic devices, or the like.

Modules or engines may also be implemented at least partially in software for execution by various types of processors. An identified module or engine may, for instance, comprise one or more physical or logical blocks of computer instructions which may, for instance, be organized as an object, procedure, or function. Nevertheless, the executables of an identified module or engine need not be physically located together, but may comprise disparate instructions stored in different locations which, when joined logically together, comprise the module or the engine and achieve the stated purpose for the module or engine.

Indeed, a module or engine of executable code may include a single instruction, or many instructions, and may even be distributed over several different code segments, among different programs, across several memory devices, or the like. Where a module or engine or portions of a module or engine are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules or engines described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It may also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Similar or like numbers may refer to like elements in the figures, including alternate embodiments of like elements unless otherwise clear from context.

FIG. 1 is a schematic block diagram illustrating one embodiment of a memory device 100 that includes a controller 160 with an XOR engine 125 and XOR buffer memory 120. As used herein, the term "XOR engine" refers to an engine or module that computes and otherwise manipulates parity data. In some embodiments, an XOR engine 125 may compute parity data for one or more blocks of nonvolatile memory. In at least one embodiment, the memory device 100 may efficiently control a non-volatile memory 140 using a controller 160 that includes an XOR engine 125 that optimizes the use of buffer memory (e.g. XRAM 120) for temporarily storing XOR data.

As used herein, buffer memory may refer to a memory or a portion of memory that is set aside as a temporary holding place for data that is being sent to or received from another component or device. In some embodiments XOR buffer memory refers to buffer memory that holds parity data generated by XOR operations. In some embodiments, the XOR engine 125 may be implemented using any of the hardware and/or software structures described above (e.g., processors, logic gates, programmable logic, firmware, software, and so forth) with respect to modules and/or engines.

In one embodiment, the memory device 100 may include one or more non-volatile memories 140. For example, in one embodiment nonvolatile memories may include NAND flash memory. However, in some embodiments, nonvolatile memories may include any type of nonvolatile memory for which parity data may be useful. In some embodiments, nonvolatile memory may include optical media, magnetoresistive memories, resistive memories and so forth. In some embodiments, a controller 160 may include a processor 145 that accesses memory 150 that may include firmware 155 (sometimes referred to as flash controller firmware or "FW") as well as other data.

In some embodiments, the processor 145 may be a multicore processor that may include one or more datapath cores that process data in the data path from the host to the non-volatile memories 140. In some embodiments, the functions described as being performed by the processor 145 may alternatively or in combination be performed by logic devices and/or firmware which may be executed by a state machine, a processor core, or any other device capable of executing specific or general instructions and/or functions. In some embodiments, the processor 145 may access a host interface module "HIM" 110 by which the host 105 may access data on the memory device 100.

In one embodiment, a write operation may occur generally as depicted in six high-level steps numbered one through six shown in circles in FIG. 1. In one embodiment, at step one, the HIM 110 may receive notification of a command and may fetch it from host space. In some embodiments, if the HIM 110 determines that the command is a write command, it may parse the command and notify the FW 155 (running on the processor 145). In one embodiment, the FW may schedule rights, determine the target physical address and reserve buffers in a transfer RAM ("TRAM") 115. In one embodiment, at step two, the HIM 110 transfers data from a host 105. In one embodiment, the HIM 110 then sends a response to the host 105 for cached host transfers.

In some embodiments, the controller 160 may include an XOR engine 125 that may compute parity data for data that is written to one or more non-volatile memories 140. In one embodiment, at step three, the FW 155 passes the command to datapath cores in the processor 145 to start processing stored data in the TRAM 115 e.g., by transferring data from the TRAM 115 to an XOR engine 125. In some embodiments, the XOR engine 125 may accumulate XOR data by successively performing bit wise exclusive or ("XOR") operations on the data that is written to the non-volatile memory and a location in memory that contains the result of prior XOR operations. In some embodiments, the XOR engine 125 may update parity data in an XOR buffer memory 120 (sometimes known as an XOR RAM or XRAM). In other words, parity data previously stored in the XRAM 120 is XORed with the data that is written and the result is stored back to the XRAM 120.

It may be noted that in some embodiments, the XOR buffer memory 120 may include memory selected from the group consisting of 6T SRAM, resistive RAM ("ReRam"), DRAM, and combinations thereof. In some embodiments, the selection of the type of memory may be determined by evaluating factors such as density, cost, manufacturing process steps, performance, and so forth of the selected memory type for the controller 160 for a given application.

In some embodiments, individual die of non-volatile memory 140, such as for example, NAND flash, may be implemented as separate die from the other memory in the controller 160. In other embodiments, certain portions of the memory such as an XOR scratch memory, which may also sometimes be referred to as a temporary (or temp) block (e.g., 607, 707), may be implemented for example in single level cell ("SLC") NAND flash that is on the same die as the NVMEM 140. As used herein the term "scratch memory" refers to a section of memory that temporarily stores data for use in subsequent operations. In some embodiments, the term "XOR scratch memory" refers to scratch memory that may be used to store results of XOR operations. In some embodiments, the XOR scratch memory may be implemented in SLC memory which may be advantageous because SLC memory typically has higher density, than for example SRAM.

In some embodiments, portions or all of the non-volatile memory 140 may be implemented on the same die as other portions of the controller with the processing logic and/or certain portions of SRAM implemented on the lower layers of the die and the nonvolatile memory e.g., NAND flash may be implemented on higher layers.

In some embodiments, the XOR engine 125 may include a low-density parity check ("LDPC") engine 175 coupled to the XOR buffer memory 120. In some embodiments, an LDPC engine 175 may include a scrambler 165 and an encoder 170. In some embodiments, at step 4, data from the TRAM is transferred to a scrambler 165 and an encoder 170 within an LDPC engine 175. In some embodiments, at step five, after data is scrambled and/or encoded an LDPC engine 175 transfers scrambled/encoded data to a buffer RAM 130 (sometimes referred to as "BRAM"). In some embodiments, at step six, the data in the buffer RAM 130 it may be read by a flash interface module "FIM" 135 and transferred to a non-volatile memory 140. It may be noted by one of ordinary skill that while nomenclature used in describing the controller 160 sometimes indirectly refers to flash memory as in flash interface module FIM 135, a controller 160 may in some embodiments be used for types of non-volatile memory 140 other than flash memory (e.g. NAND flash) for which parity data may be beneficially used for detecting and/or correcting errors.

In some embodiments, the processor 145 issues commands to read the nonvolatile memories 140 (e.g. NAND Flash) in different sized chunks of data (e.g., 16 kB/32 kB). In some embodiments, a read request is passed to a Flash Interface Module (FIM) 135. In one embodiment, a command to read data from nonvolatile memories 140 is passed to the FIM 135 which uses a Direct Memory Access (DMA) engine to read a chunk of data of a predetermined size. In one embodiment, the processor 145 issues a command to a DMA engine to read a physical plane page (e.g., 16 kB) of data from the nonvolatile memories 140. In another embodiment, the processor issues a command to a DMA engine to read a die page (e.g., 32 kB) of data from the nonvolatile memories 140.

As described above with respect to FIG. 2, in some embodiments, the XOR bins are read in pairs (e.g., 220a pairs bins 0,36 and 220b pairs 3,39). In some embodiments, host data is handled completely by a DMA engine that may be implemented using logic which may be programmable or fixed gates. For example, in one embodiment, the HIM 110 includes a DMA engine that receives data from a host and transfers receive data to TRAM 115. Similarly, in one embodiment, an LDPC engine 175 includes a DMA engine that transfers data from the T RAM 115 to a small buffer within LDPC 175 for scrambling (e.g., via scrambler 165) and encoding (e.g., via encoder 170) before transferring the data to the BRAM 130.

In some embodiments, different memories within a controller, such as for example, TRAM 115, BRAM 130, and/or XRAM 120 may be described as RAM and may be implemented using static RAM, such as for example 6T SRAM. However, it may be noted that in some embodiments, a buffer memory may be a portion of memory that may be set aside as a temporary holding place for data that may be being sent to or received from another device. Thus, buffer memories such as XRAM 120 may be implemented using any current or future type of memory that can be accessed within predetermined time frames.

For example, in some embodiments, one or more of the TRAM 115, BRAM 130, and/or XRAM 120 may be implemented in any type of volatile or non-volatile memory that meets the timing and functional requirements of a particular application. In other embodiments, the various memories of the controller 160 may be implemented in DRAM, other types of non-6T SRAM, Re-RAM, and the like. Moreover, as used herein, reference to XRAM 120 or XOR buffer memory may refer to one or more devices each having one or more blocks. Further, reference to multiple XRAMs or to XOR buffer memories may refer to multiple blocks or sections of memory implemented within one or more physical memory devices.

As described below with respect to FIGS. 2-11, in some embodiments, the XRAM 120 may include separate sections of memory corresponding to different types of data that may be stored in various blocks of non-volatile memory 140. Organizing the XRAM 120 to include separate sections of XOR buffer memory for different types of blocks with non-volatile memory 140 may be a useful architecture. However, in some embodiments, a significant improvement in memory device technology may be achieved by accumulating combined XOR data for different types of open blocks within non-volatile memory 140 using a smaller total amount of XOR buffer memory (XRAM) 120 in the controller 160. It may be noted that while the example embodiments illustrated and described with respect to FIGS. 2-11 reference particular kinds of memory and/or particular amounts of memory, the embodiments described may apply just as well or better to other kinds of memory and/or other amounts of memory.

Figure 2:
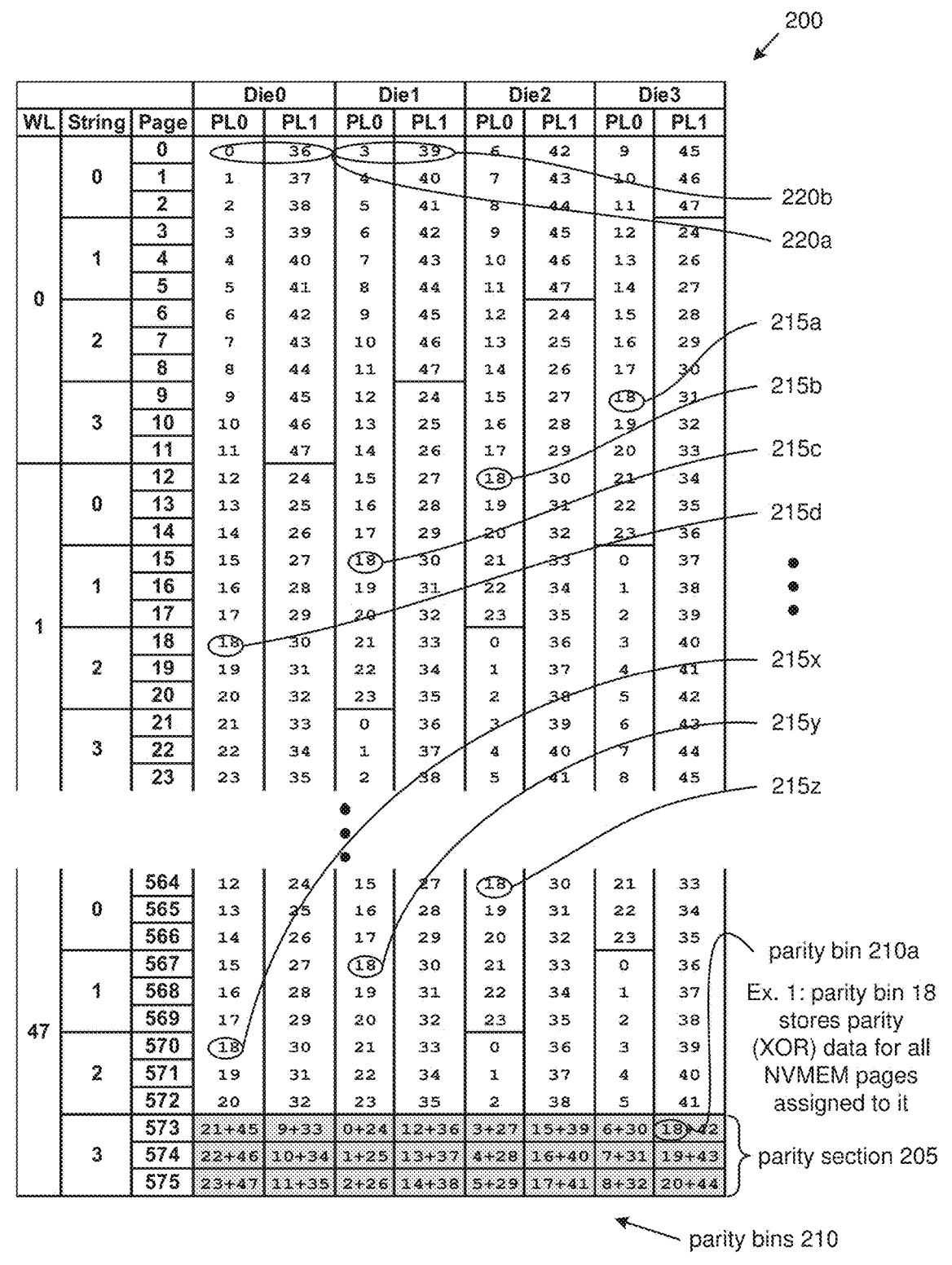

FIG. 2 is a schematic block diagram illustrating one embodiment of a block of non-volatile memory (e.g. NVMEM 140 shown in FIG. 1) having a parity section 205 that can be written when the controller determines to close the block. In one embodiment, the parity section 205 may be organized into parity bins 210 (also referred to as XOR bins) for use in error detection and/or correction of the non-volatile memory by the controller 160.

In one example embodiment, the table 200 refers to multiple die of non-volatile memory 140 e.g., Die0, Die1, Die2, Die3, as shown on the top row of table 200. It may be noted that the term "die" as used herein may be both singular and plural, e.g., one die, two die, three die, and so forth. Other plural forms of the word "die" sometime include "dice" and/or "dies". In one embodiment, each die may be organized as two planes PL0 and PL1. In another embodiment, each die may be organized as four planes, e.g. PL0, PL1, PL2, PL3. The apparatuses and methods disclosed herein may be used in various memory devices with different organizations between the number of planes and the number of die. The non-volatile memory 140 may be accessed in pages of, for example, 16 kB. Each entry in the table 200 may be assigned such that parity information for the assigned location may be accumulated to a particular XOR parity bin (e.g. a binary number). One parity bin 210 may include 16 kB worth of parity data for the assigned memory locations.

In the depicted embodiment, a parity bin 210 may be a bitwise XOR of a set of member pages. So, for example, a parity bin P1=pgA^pgB^pgC where "pg" stands for page and "^" represents a bitwise XOR operation. Because an XOR operation is its own inverse, the binary value of one page, e.g., pgA may be recovered by reversing the XOR process, which means, as used herein, XORing the parity bin with all the other member pages, e.g., pgA=P1^pgB^pgC. As used herein, the term "reversing XOR operation" refers to the fact that parity data accumulated for a particular memory location may be removed by performing an additional XOR operation with the accumulated parity data and data in the particular memory location.

As used herein, the term "scan" or "scanning" an open block refers to performing successive XOR operations on written portions of the open block to accumulate parity data for the open block or in the case of reversing XOR operations to remove parity data for the open block from the accumulated parity data. In some embodiments, parity data may be generated through use of an exclusive or operation also referred to as an XOR operation. In other embodiments, other operations or combinations of operations may be used to generate parity data. As used herein, the term "accumulate parity data" refers generally to successively performing a bitwise XOR operation between a previous XOR operation result and a next memory location.

In some embodiments, the first XOR operation may be, for example, between a result location that may be initialized to binary zero which may be then XORed with the first memory location which results in the contents of the first memory location being accumulated to the XOR result since zero XOR did with any binary number results in the binary number. Then that XOR result may be XORed with the next memory location to be scanned.

Thus, by successively performing bitwise XOR operations between the result memory location and annexed memory location to be scanned, parity data may be accumulated. In some embodiments, an open block of nonvolatile memory e.g., NAND flash may be scanned in order to store parity data for the written portions of the open block of memory so that the parity data may be written to the open block in the block may be closed.

Thus, as described below with respect to FIG. 3, in some embodiments, multiple open blocks of nonvolatile memory may be scanned to accumulate non-combined parity data for each block of the multiple open blocks. As used herein the term "non-combined parity data" refers to accumulated parity data particular to one block of nonvolatile memory. As described below with respect to FIGS. 4-11, in some embodiments, two or more open blocks may be scanned to accumulate combined parity data where the term "combined" refers to the fact that parity data from one of the open blocks may be XORed with parity data from another of the open blocks such that the resulting parity data may be considered combined parity data for multiple blocks.

As described below with respect to FIG. 5, one or more open blocks of data may be rescanned to remove parity data for the one or more open blocks from the combined parity data. As used herein combined parity data refers to accumulated parity data from at least two different blocks of memory. In some embodiments, the combined parity data may be accumulated by XOR in a previous parity result with data from two, three, or any number of open blocks of nonvolatile memory. The concept of combined parity data is illustrated and described in more detail below with respect to FIGS. 4-5 in particular.

In some embodiments, XOR parity data for write data to be written to each page of the non-volatile memory 140 may be computed and assigned to one parity bin 210 for detecting word line to word line errors and to a different parity bin for detecting plane to plane errors.

In one embodiment as depicted in the table 200, multiple pages of memory (e.g. 215a, 215b, . . . 215x, 215y, 215z) may be assigned to a specific parity bin 210, such as for example, parity bin 18 210a. In some embodiments, this means that the same bin memory in the XRAM 120 to compute parity data for one bin may be reused to further compute parity data for second bin.

It may be noted that the numbering of the assigned parity bins in the table maybe staggered in a checkerboard-like pattern so that no repeating parity bin numbers are adjacent to each other on planes PL0 and PL1. This helps use of the parity to detect plane-to-plane shorts. Similarly, there are no repeating parity bins on paired local word lines ("LWL") which helps the use of parity to detect wordline-to-wordline errors such as shorts. In some embodiments, the general rule may be that whenever there is a failure in the memory, pages which have unique bin numbers may be recovered. Thus, the staggered pattern may optimize detection of multiple types of NAND failures.

In some embodiments, the XOR engine 125 accumulates parity data for the parity bins each time one of the open blocks of nonvolatile memory is written to. In some embodiments, the data may be not directly accumulated to the parity section 205 of the nonvolatile memory. Rather it may be written to the parity bins one or more XOR buffer memories e.g. within XRAM 120 until the controller determines to close one block of the multiple open blocks at which time the XOR engine 125 program into the non-volatile memory blocks and indicates that the status=pass.

Thus, as described below with respect to FIGS. 3 through 11, in the example illustrated there are 48 bins each with 16 K worth of XOR parity data for each open block of data to be written to the non-volatile memory 140 which equals in this example 768 kB of parity bin data per open block. It may be noted by one of skill in the art that the exemplary sizes of memory, mapping of pages to particular parity bins, and other details regarding the organization and structure of the XOR buffer memory XRAM 120 may be varied without departing from the embodiments of the apparatus and methods disclosed herein.

Figure 3:
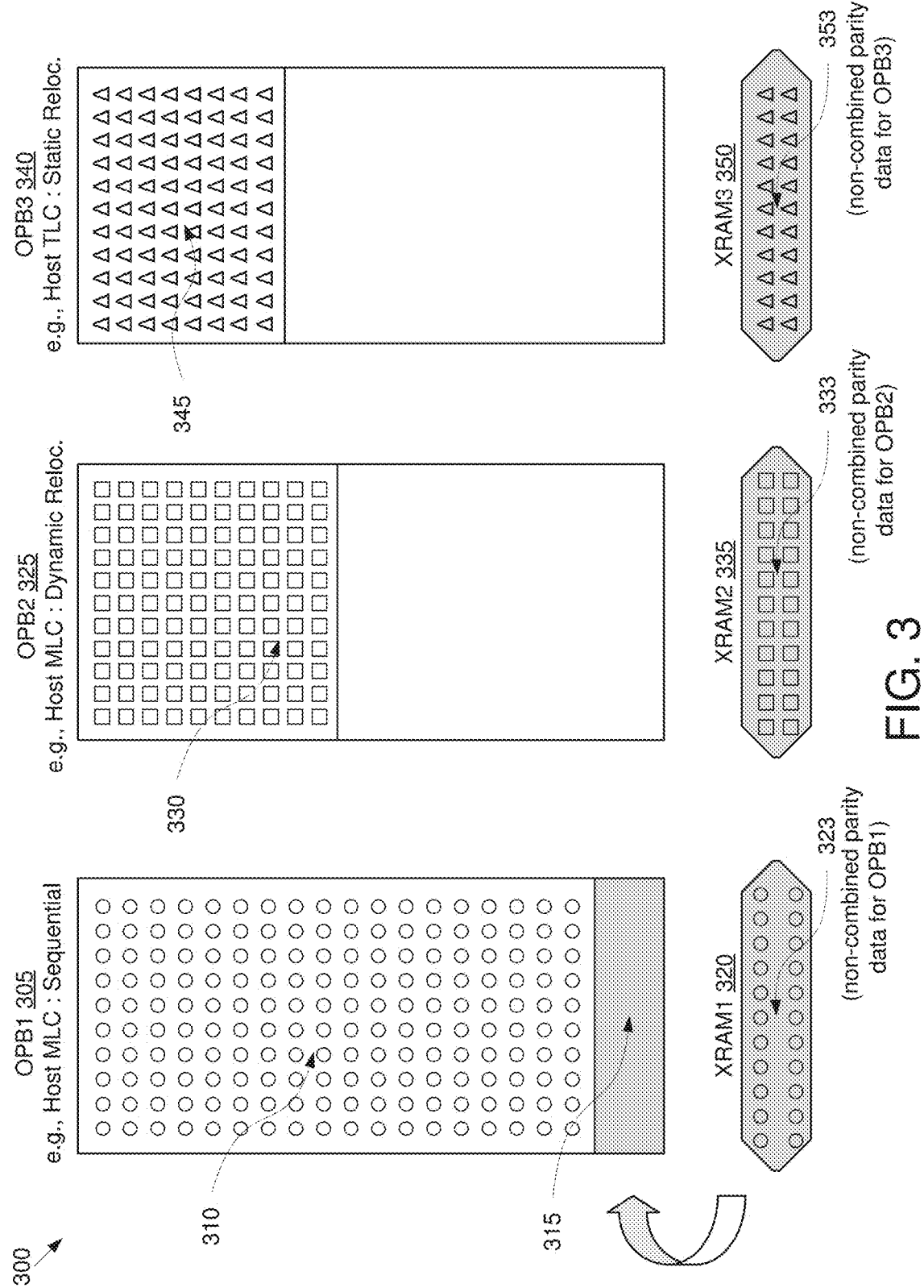
FIG. 3 is a schematic block diagram illustrating multiple XOR buffer memories for multiple open blocks of non-volatile memory.

FIG. 3 is a schematic block diagram 300 illustrating multiple XOR buffer memories (e.g. XRAM1 330, XRAM2 335, and XRAM3 350) for multiple open blocks of non-volatile memory (e.g. OPB1 305, OPB2 325, and OPB3 340). Each of the XOR buffer memories (e.g. 330, 335, and 350) accumulates non-combined parity data (e.g., 323, 335, 350) to be written to corresponding parity sections (e.g. 315) of open blocks 305, 325, 340 of non-volatile memory. As used herein, the term "non-combined parity data" refers to parity data that has been computed and/or accumulated for a particular block or section of memory.

It may be noted that the parity section 315 for the open block OPB1 305 is labeled to show that the parity section may be written in response the controller determining to close open block OPB1 305, for example, in response to the other locations within the open block OPB1 305 being fully written. As used herein, the term "fully written" refers to a predetermined portion of the block being written. In some embodiments, "fully written" means that an entire block except for a parity section has been written. In other embodiments, a block may be considered to be fully written if predetermined number of locations have been written even if certain locations besides the parity section have not yet been written. In some embodiments, the remaining open blocks, such as OPB2 325 and OPB3 340, also include their own parity sections similar to parity section 315.

In some embodiments for a particular type of non-volatile memory, such as for example NAND flash, the flash translation layer may maintain a set of open blocks at any given instant to handle different types of rights to the NAND flash blocks.

In some embodiments, the memory device (e.g., 100) may include multiple triple level cell ("TLC") open blocks to handle different types of host traffic such as host sequential reads/writes or host random read/writes. An example of one open block of this type is depicted as OPB1 305. It may be noted that sometimes TLC may be referred to as 3-bit MLC. Because MLC refers to multilevel cells, sometime the term MLC may refer to flash memory that has two or three or potentially even more levels as such technologies are developed.

Another type of open block may be used for internal relocation of data from single level cell ("SLC") flash to TLC in order to free up SLC blocks, also referred to as dynamic relocation. In a depicted embodiment, the open block OPB2 325 represents one example of this type of dynamic relocation open block.

In some embodiments, still another type of open block may be used for relocation to handle wear-leveling within the non-volatile memory, also sometimes referred to as static relocation. The open block OPB3 340 as depicted represents this type of static relocation open block. In some embodiments, as data is written to each open block e.g., OPB1 305, OPB2 325, OPB3 340, parity data is accumulated and written to the XRAM 120.

In the example illustrated in FIG. 3, the XRAM 120 may include three separate sections of XOR buffer memory (e.g., XRAM1 320, XRAM2 335, and XRAM3 350. While only three types of open blocks are depicted in FIG. 3, in some embodiments other types of open blocks may be used, for example to handle relocation for errors grown within the flash, also called blind relocation. Similarly, in some embodiments, there may be multiple open blocks for SLC to handle host random data, control data, blind relocation, and so forth.

In one embodiment, the parity bins for OPB1 e.g., the XRAM1 320, may contain non-combined parity data 323, which means as used in this example, parity data specific to open block OPB1 305. In other words, the XOR engine (e.g., 125) scans OPB1 305 to accumulated non-combined parity data 323 for OPB1. Similarly, XRAM2 335 accumulates non-combined parity data for OPB2 325 and XRAM3 350 accumulates non-combined parity data for open block OPB3 340. Using the example sizes of XOR buffer memory previously described above with respect to FIG. 3, each of the open blocks OPB1 305, OPB2 325, OPB3 340 has 768 kB worth of parity data for a total of 3×768 kB=2304 kB.

The open block OPB1 305 is depicted in FIG. 3 as fully written with data 310 (depicted with circle symbols) except for a parity section 315 so that upon writing of the non-combined parity data 323 for OPB1 (also depicted with circle symbols to show that it corresponds to write data 310) to the parity section 315 of OPB1 305 the block may be closed. In some embodiments, the parity section e.g., 315, of an open block may be located in last meta-word line of the open block.

FIG. 3 depicts the one block that the XOR engine determines to close e.g., OPB1 305 and the remaining open blocks e.g., OPB2 325 and OPB2 340. One of the remaining open blocks OPB2 325 may be partially written with data 330 (depicted with square symbols) and thus, may not be ready to be closed until it is fully written, except for a parity section (not shown, but similar to parity section 315).

As used herein, the term "remaining open blocks" may refer to any open blocks besides the one block the XOR engine has determined to close. Moreover, in some embodiments, as a controller designates additional open blocks of nonvolatile memory, the number of remaining open blocks may increase, decrease, or remain the same, because some open blocks may be closed and other blocks may be opened and the total number of remaining open blocks may vary over time.

Even though the open block OPB2 325 may be only partially written with data 330, non-combined parity data 333 may be accumulated in the XRAM2 335 with each write to the open block OPB2 325 so that when the open block OPB2 325 is full, the parity bins (XOR2 bins 335) may be written to the parity section of the open block OPB2 325 so that open block OPB2 325 may then be closed.

Likewise, another remaining open block OPB3 340 it may be partially written with data 345 and corresponding parity bins, e.g. XRAM3 350, accumulate non-combined parity data 353 with each write to the open block OPB3 340, so that it when OPB3 340 is fully written except for a parity section, parity data in XRAM3 350 may be written to the parity section (not shown, but similar to parity section 315) of the OPB3 340.

In some embodiments, at a certain point in time, one block of any number of multiple open blocks may become fully written except for a parity section. At the same time, the remaining open blocks may be only partially written. In FIG. 3, OPB1 305 is depicted as one block that the XOR engine may determine to close and the XOR engine may determine to close remaining open blocks later, e.g., OPB2 325 and OPB 340.

In some embodiments, once non-combined parity data 323 in the XRAM1 320 for the one block, e.g., OPB1 305, has been written to the parity section 315, the one block may be closed. In some embodiments, the next block to become fully written except for the parity section may be considered to be the one block the XOR engine determines to close while the XOR engine generates non-combined parity data in response to writes to any remaining open blocks e.g., OPB2 325 and OPB3 340.

Using the example sizes of memory described above, it may be noted that in some embodiments, a significant amount of XRAM 120 may be required (e.g., 768 kB per open block times three (3) open blocks=2034). Of course, in some embodiments, there may be even more open blocks e.g., OPB4, OPB5, and so forth (not shown) for other types of data e.g., blind relocation within TLC/MLC, or within various types of SLC open blocks. Although an embodiment depicted in FIG. 3 may be straightforward, other embodiments described below it may significantly improve non-volatile memory controller technology by significantly reducing the total amount of XRAM needed to temporarily store parity bin data prior to writing the data to the parity section e.g. parity section 315 so that the block may be closed.

Figure 4:
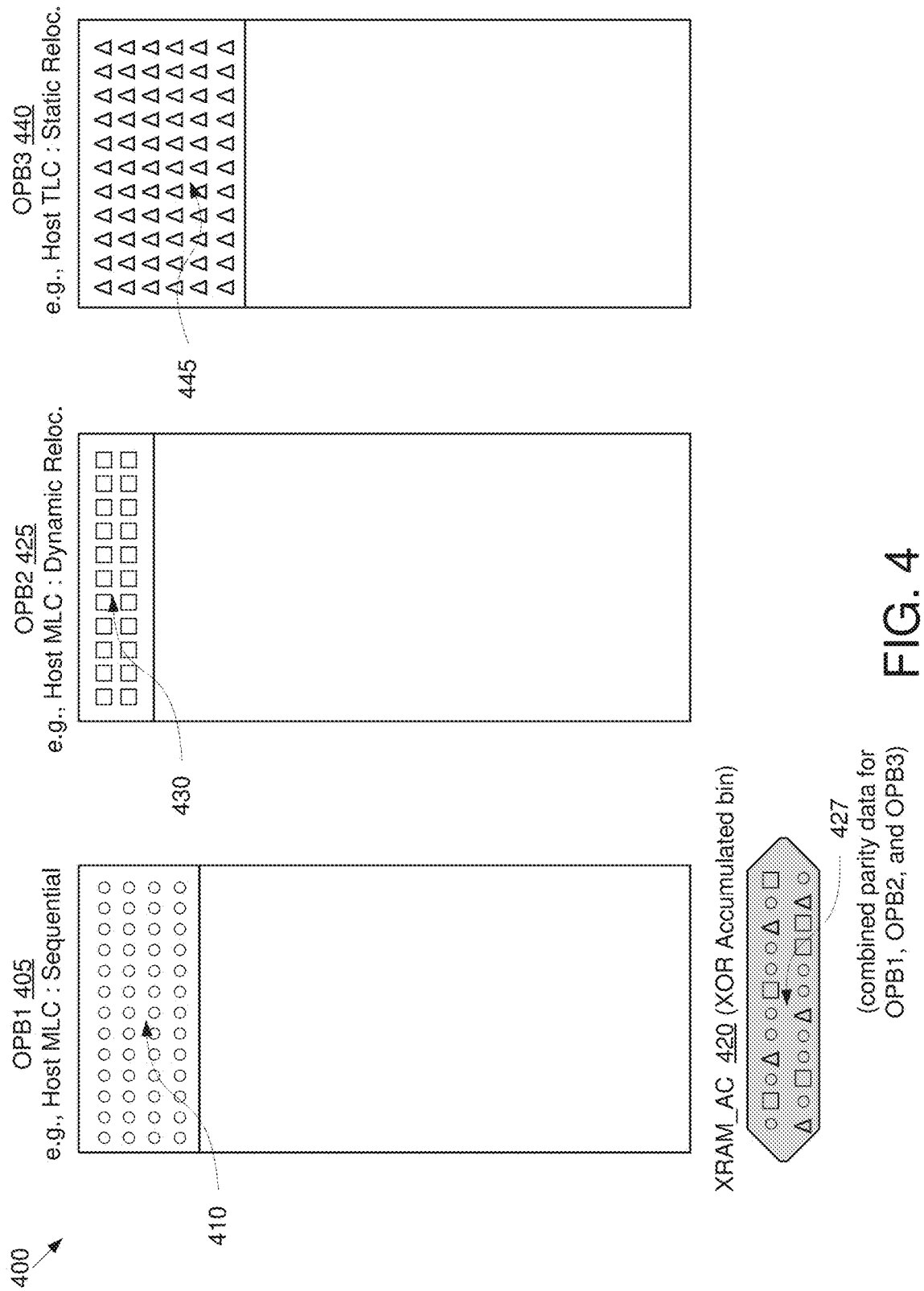
FIG. 4 is a schematic block diagram illustrating an XOR buffer memory that accumulates combined parity data for multiple open blocks of non-volatile memory.

FIG. 4 is a schematic block diagram illustrating an XOR buffer memory (e.g., XRAM_AC 420) that accumulates combined parity data 427 for multiple open blocks of non-volatile memory e.g., OPB1 405, OPB2 425, OPB3 440. As previously stated, in some embodiments, the term "combined parity data" refers to the fact that parity data calculated for a portion of one block of nonvolatile memory, using for example exclusive or (e.g., XOR) operations, may have additional XOR operations performed on the resulting parity data with data from a different block of nonvolatile memory. Thus, parity data from one open block of nonvolatile memory may be combined with parity data from another block of nonvolatile memory block of nonvolatile memory to result in combined parity data. In some embodiments, a small dedicated buffer can be allocated in XRAM_AC 420 may be allocated for scanning the open blocks. For example, in one embodiment, the small dedicated buffer may be 16 kB (e.g., the size of a plane page). In another embodiment, the small dedicated buffer may be 32 kB (e.g., the size of a die page).

In an embodiment depicted in FIG. 4, as data (e.g., 410, 430, 445) is written to each of the different open blocks (e.g. OPB1 405, OPB2 425, and OPB3 440), the XOR engine 125 accumulates combined parity data 427 from each of the different open blocks to a common XOR buffer memory e.g., XOR_AC 420. Because data in any one parity bin within XOR_AC 420 includes data e.g., 410, 430, 445 written to the three different types of open blocks e.g., OPB1 505, OPB2 525, and OPB3 540, the combined parity data is depicted with a combination of circle, square, and triangle symbols.

Figure 5:
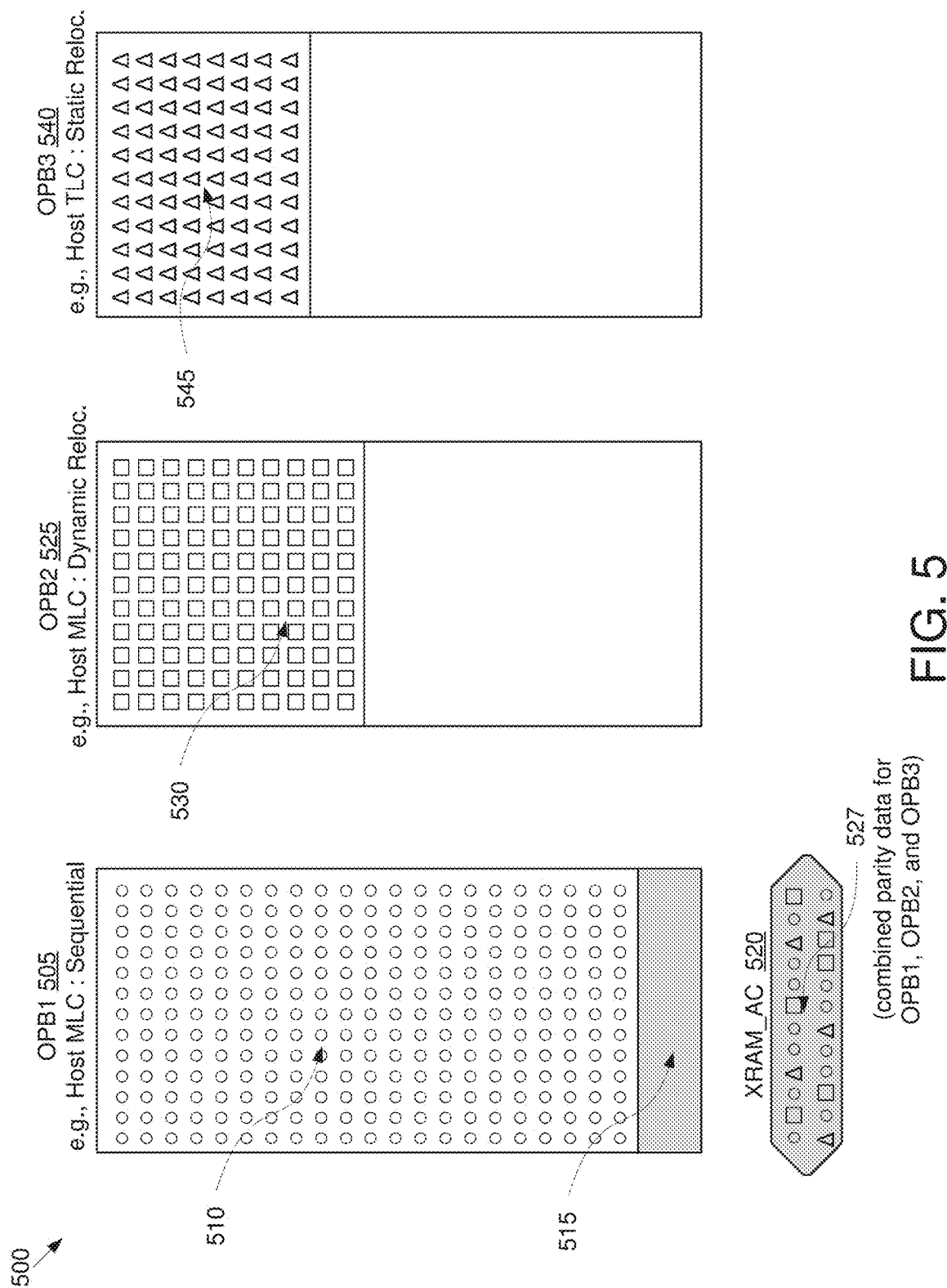
FIG. 5 is a schematic block diagram illustrating an XOR buffer memory with combined parity data for multiple open blocks of non-volatile memory for which the controller determines to close one block.

FIG. 5 is a schematic block diagram 500 illustrating an XOR buffer memory XRAM_AC 520 that accumulates combined parity data 527 for multiple open blocks of non-volatile memory (e.g. OPB1 505, OPB2 525, and OPB3 540) for which the controller determines to close one block (e.g., OPB1 505) which has been fully written except for a parity section 515. In describing FIG. 5, reference may also be made to FIGS. 1, 10, and 11.

FIG. 5 depicts generating combined parity data for multiple open blocks (e.g. OPB1 505, OPB2 525, and OPB3 540) of non-volatile memory using one XOR buffer memory 520. One open block OPB1 505 is depicted as being fully written (e.g., with written data 510 depicted as squares). Two remaining open blocks OPB2 525 and OPB2 540 are depicted as partially written (e.g., with written data 530 and 545 respectively. In some embodiments, generating combined parity data for multiple open blocks of non-volatile memory using one XOR buffer memory may be done using methods described in more detail below in FIGS. 10, 11.

In some embodiments, generating combined parity data 527 for multiple open blocks may be accomplished using a memory device such as memory device 100 shown in FIG. 1 that may include a controller 160 for non-volatile memory 140. The controller 160 may include an XOR engine 125 that, as illustrated in the method depicted in FIG. 10, accumulates 1005 combined parity data 527 in a XOR buffer memory (e.g., XRAM 120 of FIG. 1 and more specifically XRAM 120 designated for storing combined XOR data such as XOR_AC 420, 520, and 620 depicted in FIGS. 4,5, and 6) in response to write operations to one block of multiple open blocks of non-volatile memory (e.g., OPB1 405, 505, 905) and to the remaining open blocks (e.g., OPB2 525 and OPB3 540) of non-volatile memory 140.

In some embodiments, the controller 160 may generate and/or extract non-combined parity data (depicted below as 643 in FIG. 6) for the one block (e.g., OPB1 505) of non-volatile memory that the controller 160 determines to close. For example, in response to determining that the one block (e.g. OPB1 505) of non-volatile memory is fully written (e.g. with written data 510) except for a parity section 515. In some embodiments, the controller 160 may close the one block e.g., OPB1 505 of non-volatile memory 140 by programming the non-combined parity data to the parity section 515 of the one block (e.g., open block OPB1 505) of non-volatile memory 140.

Figure 6:
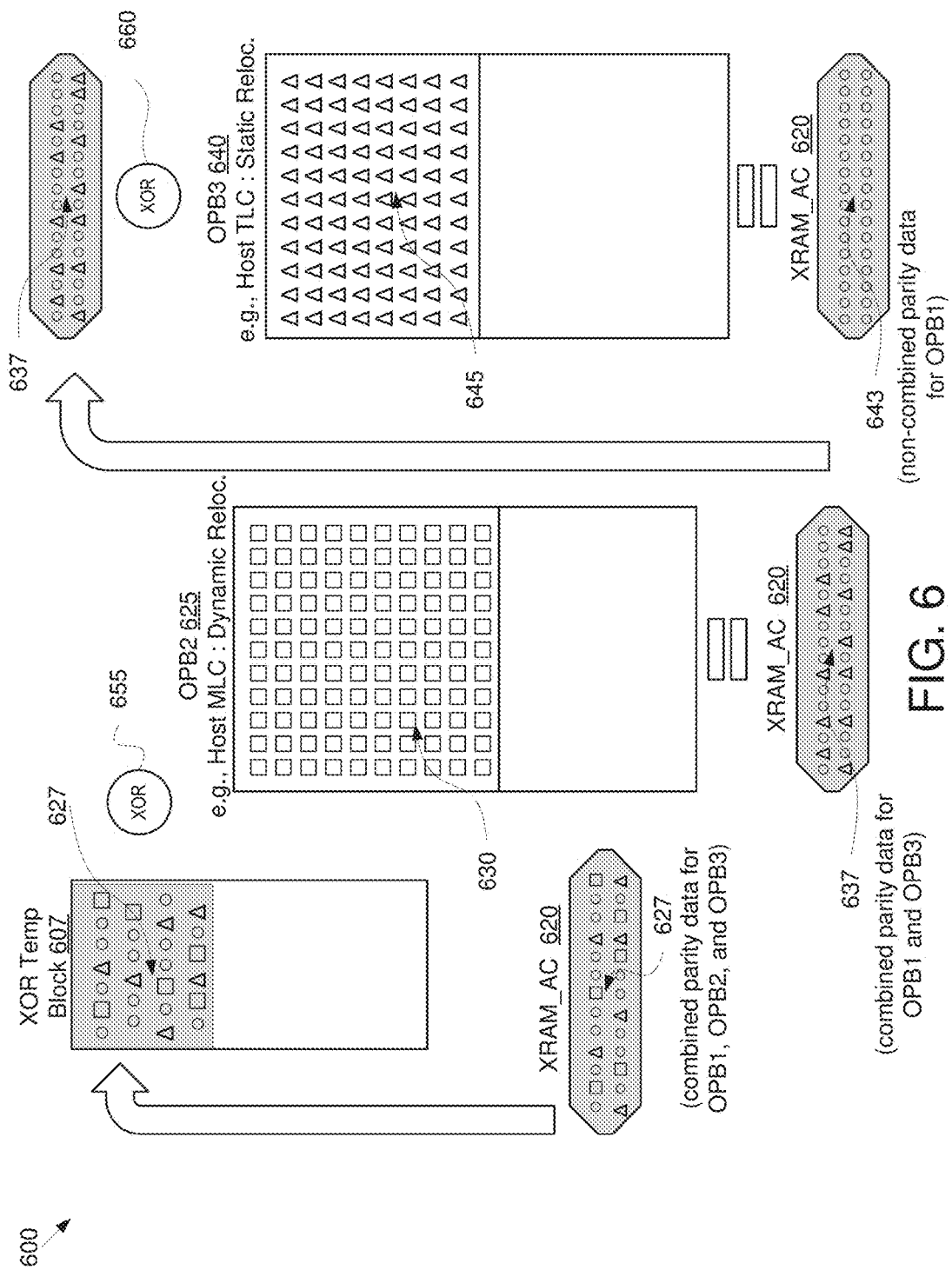
FIG. 6 is a schematic block diagram illustrating generating non-combined parity data for one block of non-volatile the controller has determined to close by performing reversing XOR operations on the combined parity data and data from the remaining open blocks.

FIG. 6 is a schematic block diagram illustrating one embodiment of the apparatus 600 (which may be the same as apparatus 400 of FIG. 4) that generates a block of non-combined parity data 643 for writing to the parity section of the one block e.g. OPB1 by performing reversing XOR operations 655, 660 on the combined parity data 627 and data from the remaining open blocks e.g. OPB2 625 and OPB3 640.

In one embodiment, the controller 160 may accumulate combined XOR data for the one block the controller determines to close e.g. OPB1 505. In some embodiments, the controller 160 may store a copy of the combined parity data 627 to a temporary memory location e.g., XOR temp block 607. In some embodiments, the XOR temp block 607 may be implemented in SLC NAND flash. As used herein, the term XOR may sometimes be used as a verb meaning to perform XOR operations. In some embodiments, the combined parity data 627 may then be XORed with corresponding data 630 in one of the remaining open blocks OPB2 625. This produces combined parity data 637 for OPB1 505 and OPB3 640 but the XOR operation 655 with the data 630 for OPB2 625 reverses the effect of prior XOR operations performed on the data 630 (a reversing XOR operation may also be referred to as de-XOR or de-Exor) because an XOR function is its own inverse, as explained above with respect to FIG. 2.

In some embodiments, the combined parity data 637 for OPB1 and OPB3 may be then XORed 660 with the data 645 written to another of the remaining open block OPB3 640. This reverses the XOR operations previously performed on the combined parity data 637 with the written data 645 in OPB3 640 to produce non-combined parity data 643 for the one block the XOR engine determines to close e.g. OPB1 505.

In one embodiment, the controller 160 then closes the one block OPB1 505 of non-volatile memory 140 by programming the non-combined parity data 643 to the parity section e.g., 515 of the one block OPB1 505 of non-volatile memory 140. For purposes of this disclosure, whichever of the one or more open blocks OPB2 625 and OPB3 640 fills up next may be referred to as the one block the XOR engine 125 has determined to close and any other open blocks may be referred to as the remaining open blocks. In some embodiments, the XOR engine 125 may continue to accumulate combined parity data (also referred to sometimes as combined XOR data) for the open blocks and to generate non-combined data for the new one open block it determines to close when it becomes fully written except for a parity section.

Figure 7:
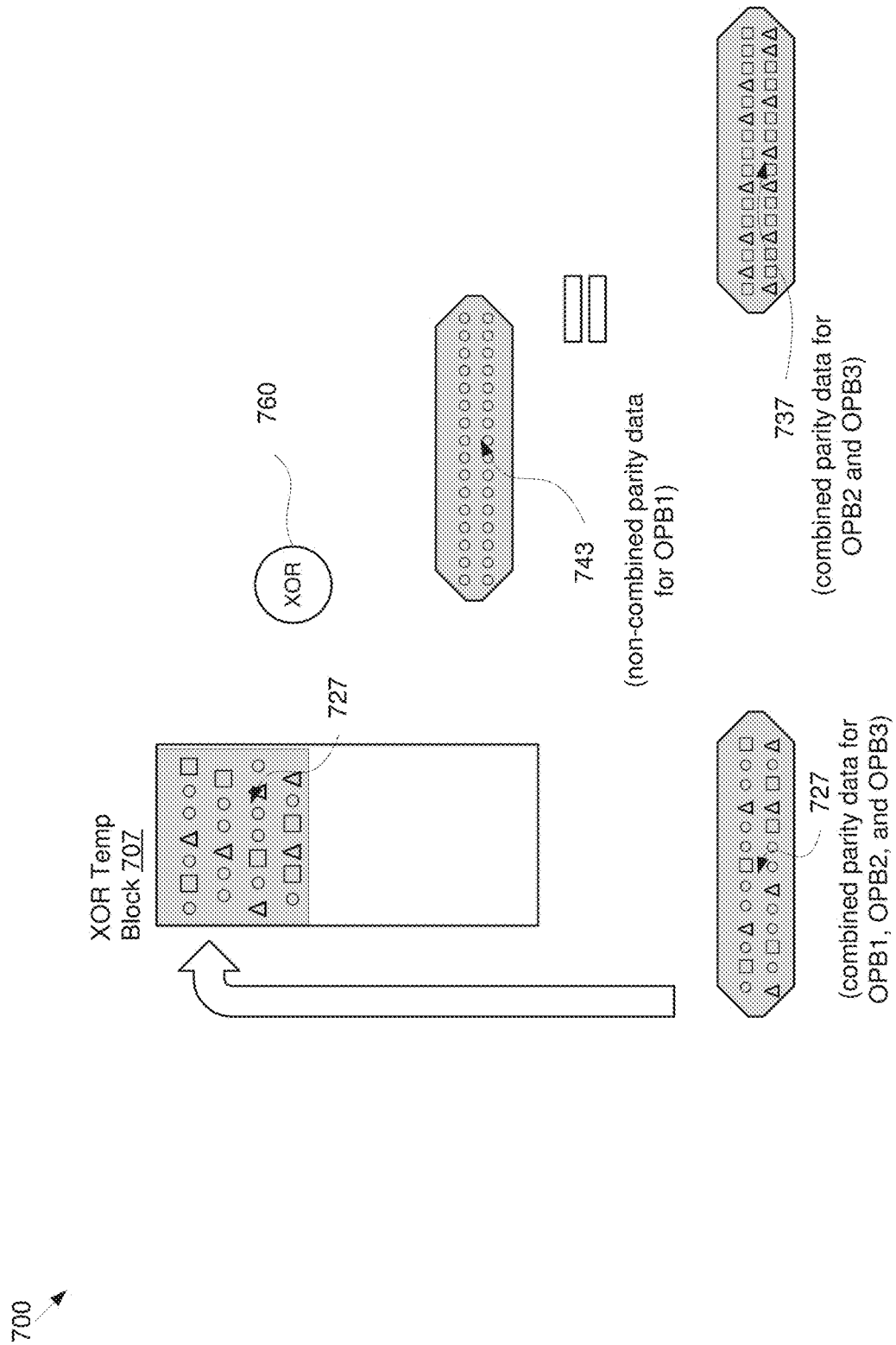
FIG. 7 is a schematic block diagram illustrating removing parity data for the one block determined to close to generate a combined block of parity data for further accumulation of combined parity data for the remaining open blocks of non-volatile memory.

FIG. 7 is a schematic block diagram illustrating one embodiment of an apparatus 700 (which may be the same as the apparatus of FIG. 4) that generates combined parity data 737 for further accumulation of combined parity data for still open blocks (e.g., OPB2, OPB3) of non-volatile memory 140. In one embodiment depicted in FIG. 7, one block that the XOR engine determined to close e.g., OPB1 has been closed and parity data for that one block OPB1 now needs to be removed from the combined parity data 727 for OPB1, OPB2, and OPB3 which was previously stored to XOR scratch (temp) block 707. The combined parity data 727 for OPB1, OPB2, and OPB3 stored in XOR block 707 is XORed 760 with the non-combined parity data 743 for OPB1. This reversing XOR operation 760 thereby removes and/or extracts the non-combined parity data 743 for OPB1 from the combined parity data 727 resulting in combined parity data 737 OPB2 and OPB3.

If one or more additional open blocks beyond OPB2 and OPB3 are still open then the combined parity data 737 for OPB2 and OPB3 can be further combined with parity data accumulated from the remaining open blocks. Whichever of the remaining open blocks becomes fully written next (except for a parity section) may be referred to as the "one block" which means as used herein the one block that the XOR engine has determined to close and any other blocks that are still open or are newly designated as open blocks are referred to as remaining open blocks and the process may repeat substantially as described above.

Thus, parity data for each of the open blocks e.g. OPB1, OPB2, OPB3 and so forth may be computed and stored in the blocks the XOR engine determines to close may be accumulated using only a fraction of the memory for XRAM 120 that would be required if separate sections of XRAM 120 were allocated for each type of open block. In some embodiments, this may have the beneficial result providing a significant improvement to controller technology by reducing the cost and area required for XRAM 120.

Figure 8:
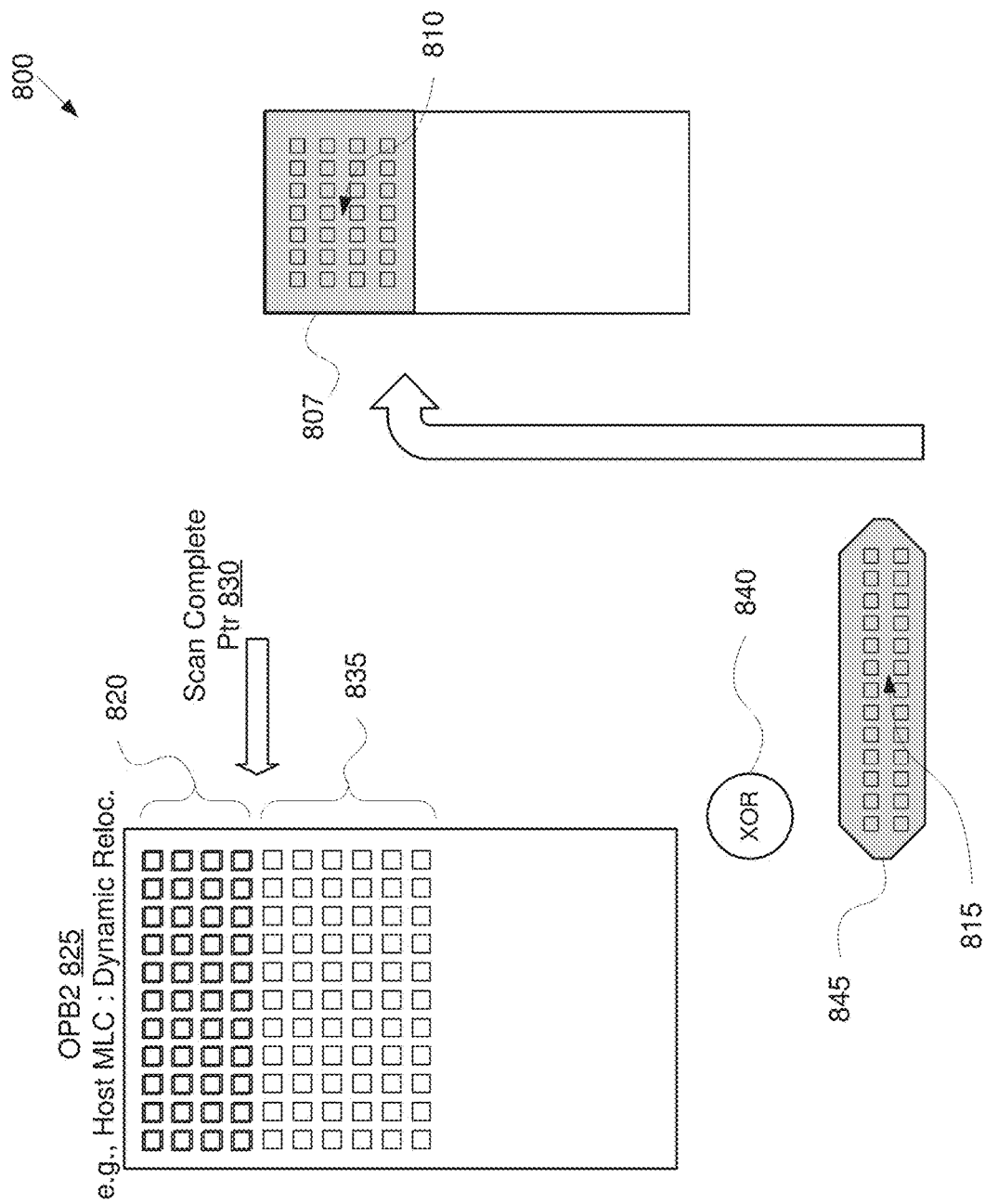
FIG. 8 is a schematic block diagram illustrating accumulating a portion of combined parity data using background operations.

Referring now to FIGS. 1, 6, and 8, FIG. 8 is a schematic block diagram 800 illustrating accumulating a portion of parity data 815 using background operations. As explained above with respect to FIGS. 5, 6, and 7, the various embodiments of the XOR engine described above can substantially improve memory device controller technology by reducing the amount of XRAM 120 required for temporarily storing parity data to be written to each type of open block. In some embodiments, the process of accumulating parity data for open blocks of non-volatile memory may be referred to herein as "scanning" the open blocks (e.g. OPB2, OPB3). Similarly, the process of performing reversing XOR operations on open blocks of memory may also be referred to as scanning or, if for example the blocks have been previously scanned, may be referred to as rescanning the open blocks.

As described above, the XOR engine first scans the open block to generate the combined parity data for the one block and the remaining open blocks. Thus, the total amount of XOR buffer memory needed is reduced as compared to having a separate XOR buffer memory to accumulate non-combined parity data for each of multiple open blocks. The combined parity data may be stores to an XOR temp block so that it can be used again as the XOR engine rescans the remaining open blocks to reverse the XOR operations from the remaining open blocks. This process of scanning and rescanning the remaining open blocks can be time-consuming which may impact performance of the controller 160 slightly.

In one embodiment, the scanning and/or rescanning of the remaining open blocks may be scheduled as background operations in order to offset the potential performance impact of scanning the remaining open blocks as described in more detail below.

In one embodiment, the XOR buffer memory 845 may be configured to accumulate a predetermined portion of parity data for at least one of the one block and the remaining open blocks. In one embodiment, the XOR engine 125 may scan a plurality of open blocks to accumulate combined parity data to the XOR buffer memory as background operations to the write operations wherein a status of the scanning is indicated by scan complete pointers for each of the plurality of open blocks. In some embodiments, the controller 160 may include a scheduler that detects write operations to non-volatile memory 140 and schedules write operations as foreground operations and schedules the operations of accumulating combined parity data in the XOR buffer memory (e.g., OPB1, OPB2, and OPB3) as background operations in response to detecting the write operations, such that write operations to the non-volatile memory 140 are not interrupted by the XOR engine 125.

Using the example sizes of open blocks described above with respect to FIG. 2, in one embodiment, the XOR buffer memory 845 may be configured to have a size sufficient to hold a portion of parity, e.g., two bins of parity data where each bin has a size of 16 kB for a total of 32 kB. Since the parity section of each open block in the examples describe above includes 48 bins of 16 kB each, the parity data accumulated in the XOR buffer memory 845 may be copied to a temporary block of XOR memory (e.g., XOR temp block 807) as the XOR buffer memory 845 that holds the predetermined portion (e.g., two bins worth) of parity data 815 becomes full.

In some embodiments, an XOR temp block 807 may be an SLC block that has a size which depends on the technology node of the nonvolatile memory 140. For example, in one embodiment, the XOR temp block 807 has a size of 12 MB for particular technology node. In another embodiment, the XOR temp block 807 has a size of 18 MB in another technology node. In still another embodiment the XOR temp block 807 has a size of 24 MB in a further technology node. In some embodiments, nonvolatile memory such as for example NAND flash has a significantly higher density than volatile memory such as SRAM.

In some embodiments, a scan complete pointer 830 marks an address in an open block being scanned e.g. OPB2 825 which indicates the point up to which the open block has been scanned. As depicted in FIG. 8, in some embodiments, a portion 820 of the written data has been scanned (e.g., accumulated) in the parity data 815 through XOR operations 840. Foreground operations may result in the background operations being suspended until the foreground operations have been completed. Thus, the scan complete pointer 830 may remain continue to point to a certain address until the scanning operations scheduled as background operations resume. When the background operations are resumed, they may begin at the address of the open blocks pointed to by scan complete pointer 830 and continue scanning the block to compute parity data for the remaining data 835 which has been written by the foreground write operations which has not yet been scanned by the background operations.

Figure 9:
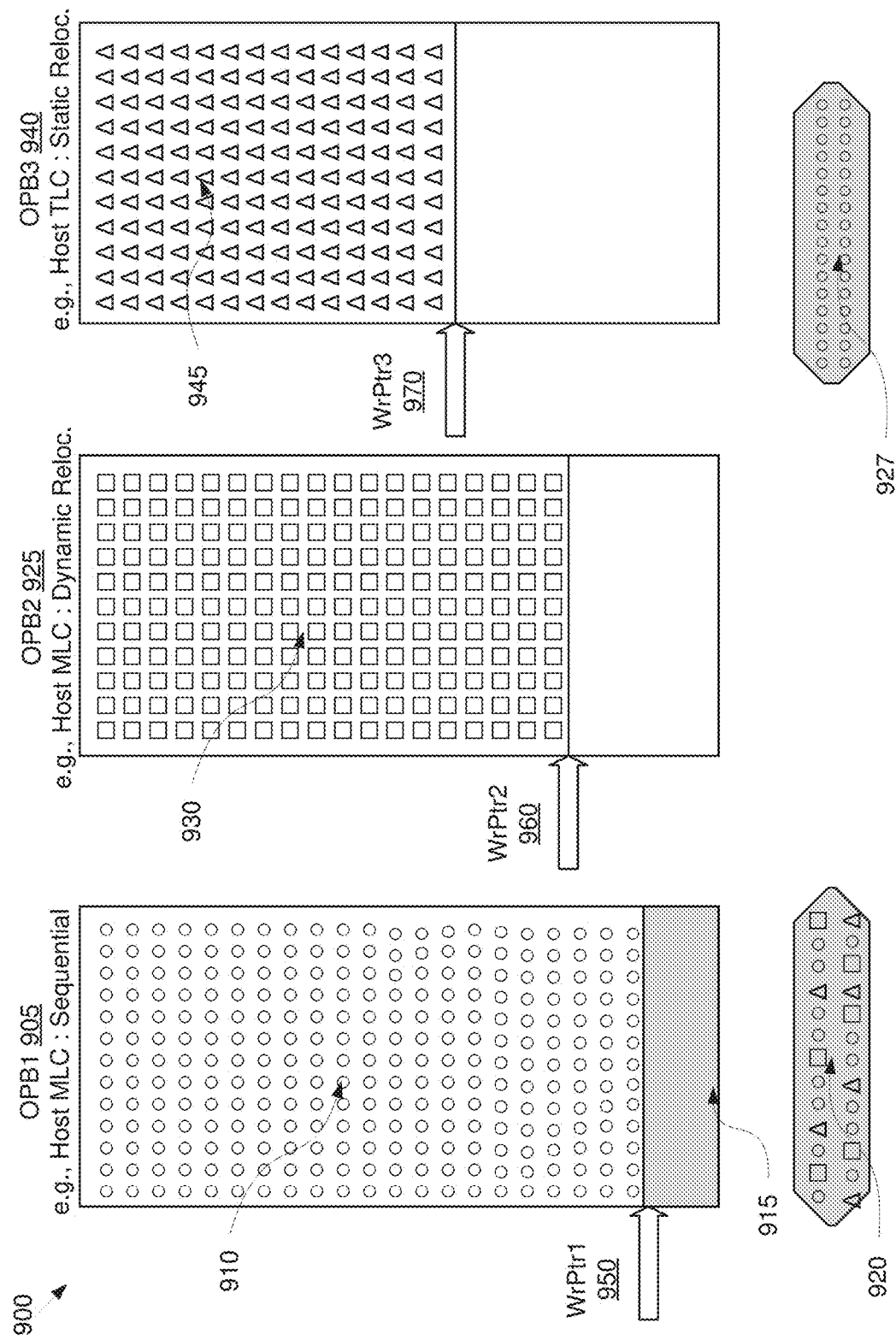
FIG. 9 is a schematic block diagram illustrating determining whether to generate non-combined data by scanning the remaining open blocks to remove corresponding parity data from the combined or rescanning the one block the controller determined to close.

FIG. 9 is a schematic block diagram 900 illustrating determining whether to generate non-combined parity data 927 by scanning the remaining open blocks e.g., OPB2 925 and OPB3 940 to remove corresponding parity data from the combined parity data 920 or by rescanning the one block e.g., OPB1 905 the controller determines to close.

In some embodiments, XOR engine 125 one example of write pointers that in some embodiments may help determine whether a written portion e.g., 910 of the one block e.g., 905 is less than a total of written portions e.g., 930, 940 of a remainder of the plurality of open blocks, e.g., OPB2 925, OPB3 940. In some embodiments, the XOR engine 125 determines whether the written portion 910 of the one block 905 is less than the total of the written portions of the remaining open blocks e.g., 925, 940 by determining whether a write pointer 950 for the one block is less than a sum of write pointers 960, 970 for the remainder of the plurality of open blocks.

If the written portion 910 of the one block 905 is less that the total of the written portions of the remaining open blocks e.g., 925, 940, then in response, the XOR engine 125 generates the non-combined parity data 927 for the one block of non-volatile memory (e.g. OPB1 905) by re-scanning the one block of non-volatile memory to directly calculate the non-combined parity data 927 for the parity section 915 of the one block of non-volatile memory OPB1 905.

In other words, if it takes more operations, time, and/or resources, to perform reversing XOR operations on the remaining open blocks e.g. OPB2 925, OPB3 940 to remove corresponding data for the remaining open block from the combined parity data 920 than it does to rescan the one block e.g., OPB1 905, then the XOR engine directly computes non-combined parity data 927 by rescanning the one block e.g. OPB1905 to directly compute the non-combined parity data 927.

In some embodiments, if the written portion 910 of the one block 905 is not less than the total of the written portions of remaining block e.g., 925, 940, then the XOR engine 125 performs reversing XOR operations of the combined parity data 920 with the written portions of data 930, 945 of OPB3 925, OPB3 940 to remove the corresponding parity data leaving only non-combined parity data 927 for the one block e.g. OPB1905. Thus, the XOR engine 125 in the depicted embodiment reduces the performance impact of the reversing XOR operations in circumstances under which those reversing XOR operations would take more time than directly calculating the non-combined parity data for the one block the XOR engine determined to close.

Figure 10:
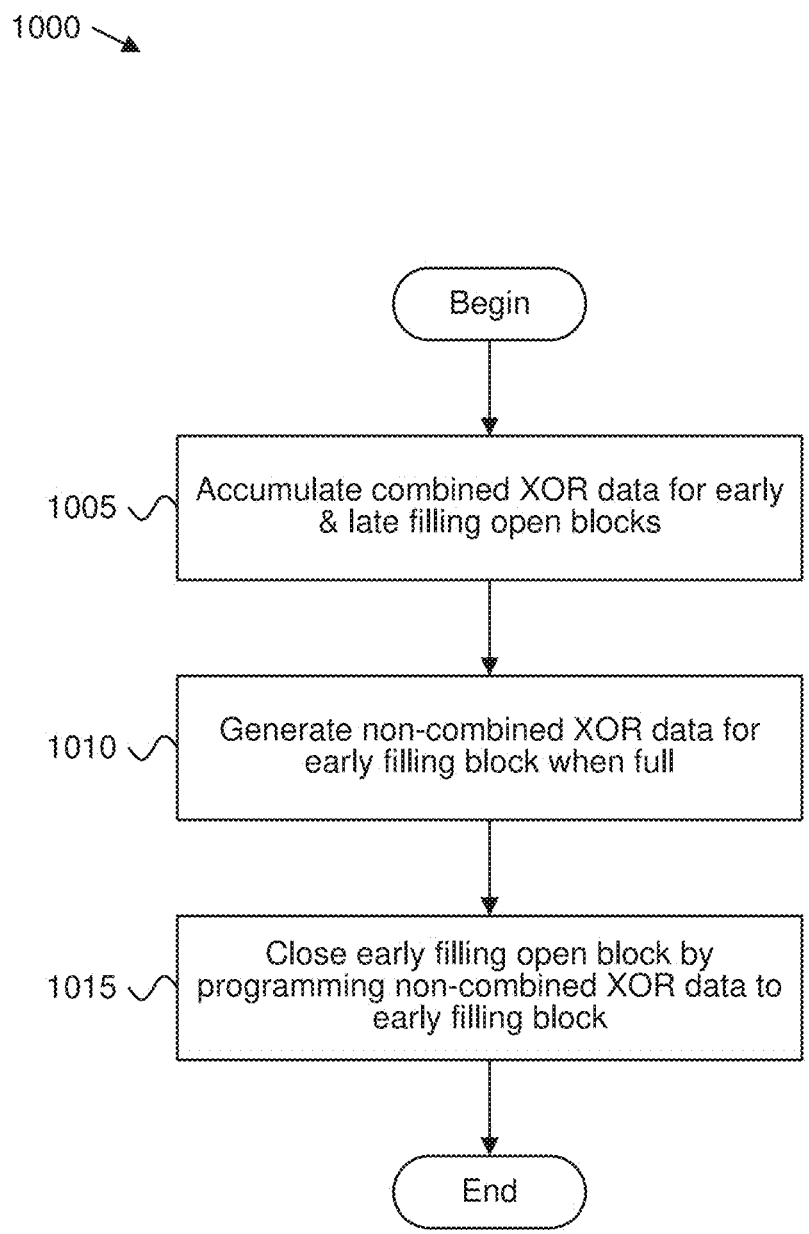
FIG. 10 is a schematic flow chart diagram illustrating one embodiment of a method for efficiently generating parity sections for multiple open blocks of non-volatile memory using one XOR buffer memory.

FIG. 10 is a schematic flow chart diagram illustrating one embodiment of a method 1000 for efficiently generating parity sections for multiple open blocks of non-volatile memory using one XOR buffer memory.

In some embodiments, the method 1000 begins and includes accumulating 1005 combined XOR data in an XOR buffer memory in response to write operations to one block the XOR engine determined to close of non-volatile memory and to remaining open blocks of non-volatile memory. In some embodiments, accumulating 1005 combined XOR data in an XOR buffer memory may be performed using one or more embodiments of the apparatus is described above with respect to FIGS. 1 through 8.

The method 1000 continues and further includes generating 1010 non-combined XOR data for the one block the XOR engine determined to close of non-volatile memory in response to determining that the one block the XOR engine determined to close of non-volatile memory is full. In some embodiments, generating 1010 the non-combined XOR data for the one block the XOR engine determined to close of non-volatile memory in response to determining that the one block the XOR engine determined to close of non-volatile memory is full may be done using background operations as described above with respect to FIG. 8.

In some embodiments, generating 1010 the non-combined XOR data for the one block the XOR engine determined to close of non-volatile memory in response to determining that the one block the XOR engine determined to close non-volatile memory is full, may be done by directly rescanning the one block the XOR engine determined to close to directly compute non-combined XOR parity data. In other embodiments, generating 1010 the non-combined extra data for the one block the XOR engine has determined to close may be done by reversing the XOR operations in the accumulated combined XOR parity data for the remaining open blocks.

The method 1000 continues and includes closing 1015 the one block the XOR engine determined to close of non-volatile memory by programming the non-combined XOR data to the one block the XOR engine determined to close of non-volatile memory.

Figure 11:
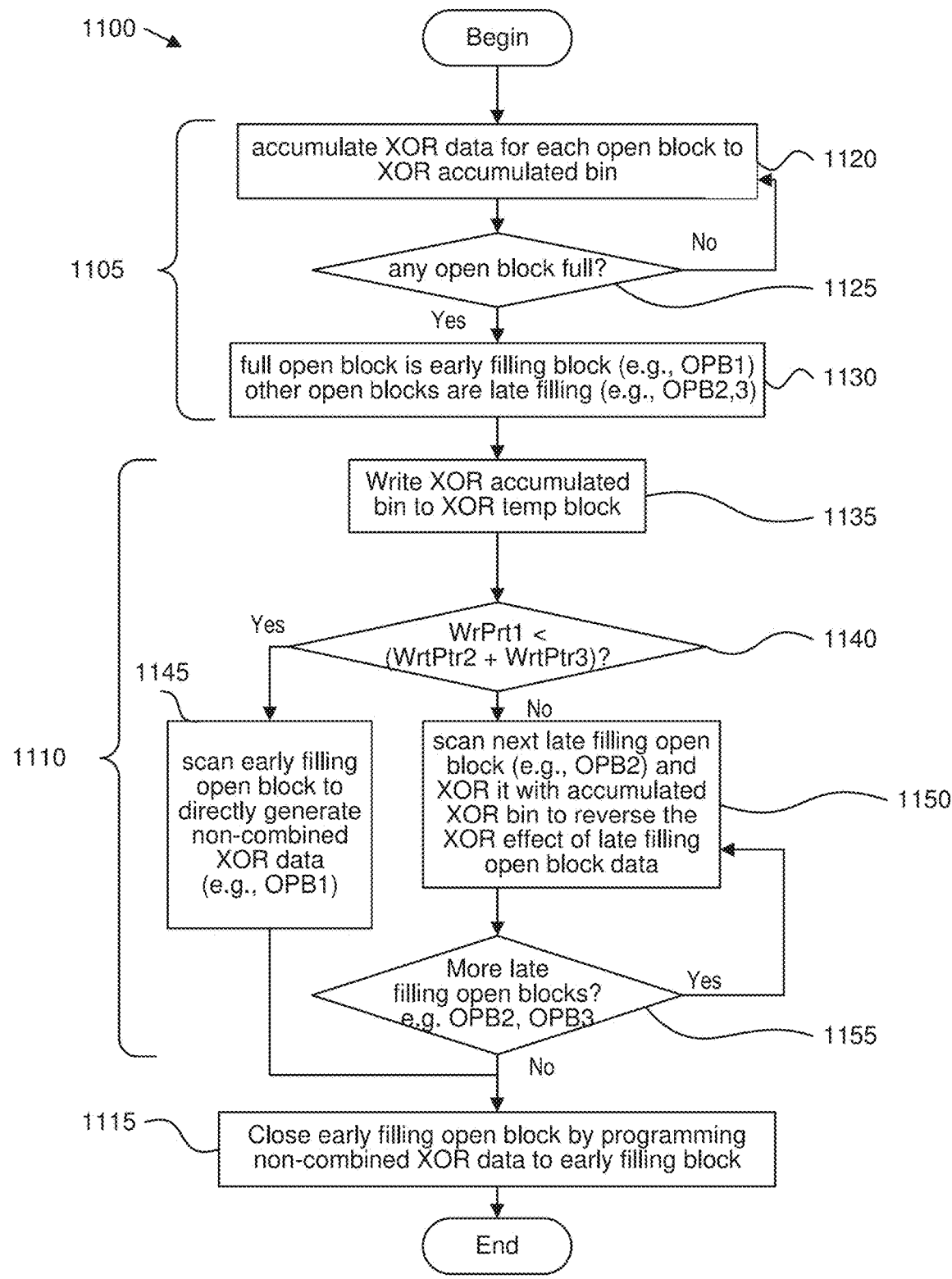
FIG. 11 is a schematic flow chart diagram illustrating another embodiment of a method for efficiently generating parity sections for multiple open blocks of non-volatile memory using one XOR buffer memory.

FIG. 11 is a schematic flow chart diagram illustrating another embodiment of a method 1100 for efficiently generating parity sections for multiple open blocks of non-volatile memory using one XOR buffer memory.

In some embodiments, the method 1100 begins and includes accumulating 1105 combined XOR data in an XOR buffer memory in response to write operations to one block the XOR engine determined to close of non-volatile memory and to remaining open blocks of non-volatile memory. In some embodiments, the method 1100 includes detecting write operations to the non-volatile memory and accumulating the combined parity data in the XOR buffer memory that is coupled to a low-density parity check engine that may substantially be the same as the LDPC engine 175 described above with respect to FIG. 1.

In some embodiments, the act of accumulating 1105 combined parity data includes the act of accumulating 1120 XOR data for the one block the XOR engine determined to close e.g. OPB1 and remaining open blocks e.g. OPB2, OPB3, and so forth to an XOR accumulated bin.

The method 1100 continues and includes determining 1125 whether any of the open blocks are fully written except for a parity section and processing 1130 one open block e.g. OPB1 as one open block the XOR engine has determined to close and other open blocks as remaining open blocks e.g. OPB2, OPB3 and so forth. In some embodiments, accumulating 1105 combined parity data in XOR buffer memory in response to write operations may be done substantially as described above with respect to FIGS. 6 through 8.

In some embodiments, the method 1100 continues and includes generating 1110 non-combined parity data for the one open block of non-volatile memory that the XOR engine has determined to close in response to determining that the one open block of non-volatile memory has been fully written except for a parity section.

In some embodiments, generating 1110 non-combined parity data for the one open block of non-volatile memory may include determining whether the full size of the one open block of non-volatile memory the XOR engine has determined to close is less than the total size of written portions of the remaining open blocks of non-volatile memory and generating the non-combined XOR data for the one open block of non-volatile memory by re-scanning the one open block of non-volatile memory that the XOR engine determines to close to directly calculate the non-combined XOR data for the one open block of non-volatile memory in response to determining that the full size of the one open block of non-volatile memory is less than the total size of written portions of the remaining open blocks of non-volatile memory.

For example, in some embodiments, the act of generating 1110 non-combined parity data for the one open block of non-volatile memory which has been determined to close includes writing 1135 combined parity data to a scratch memory e.g., XOR temp block 607, 707. The method 1100 continues and may include determining 1140 whether a write pointer pointing to the location of the most recent data written to the one open block determined to close e.g. OPB1 is less than the sum of write pointers plane to the locations of most recent data written to the remaining open blocks e.g. OPB2, OPB3 or written as an expression, determining 1140 whether WrPrt1 <(WrtPtr2+WrtPtr3).

In some embodiments, if the full size of the one open block of non-volatile memory determined to close is less than the total size of written portions of the remaining open blocks of non-volatile memory (e.g., if WrPrt1 <(WrtPtr2+WrtPtr3)), then the method 1100 continues and includes scanning 1145 the one open block directly to generate non-combined XOR parity data for the one open block. In some embodiments, the method 1100 continues and includes closing 1115 the one open block the XOR engine determines to close by programming the non-combined XOR data to the one open block of non-volatile memory.

If the full size of the one open block of non-volatile memory the XOR engine determines to close is not less than the total size of written portions of the remaining open blocks of non-volatile memory (e.g., if WrPrt1 ≥(WrtPtr2+WrtPtr3)), then the method 1100 may continue and may include generating non-combined XOR data for the one open block of non-volatile memory determined to close by scanning 1150 the written portions of the remaining open blocks of non-volatile memory to reverse the effect on the combined XOR data of the XOR operations performed on the remaining open blocks of non-volatile memory.

In some embodiments, the method 1100 continues and may include determining 1155 whether any of the remaining open blocks are still open. If so, the process may be repeated until all of the XOR parity data from the remaining open blocks has been reversed and the non-combined XOR parity data for the one open block determined to close has been generated, at which point the method continues and includes closing 1115 the one open block of non-volatile memory determined to close by programming the non-combined XOR data to a parity section of the open block of non-volatile memory, and the method 1100 ends.

It may be noted that in some embodiments, the act of determining 1140 whether the full size of the one open block of non-volatile memory the XOR engine determines to close is less than the total size of written portions of the remaining open blocks of non-volatile memory may be optional and may be omitted such that the method 1100 may proceed directly from the act of writing 1135 the combined parity to the XOR scratch memory (e.g., XOR temp block) to the act of scanning 1150 the remaining open block and XORing it with the accumulated XOR bin to remove parity data generated from the remaining open blocks.

It may further be noted by one of skill in the art, that one, some, or all of the embodiments described in methods 1000 and method 1100 may be implemented using the controller 160 and other means as described above with respect to FIGS. 1 through 9.

In some embodiments, a system e.g., 100 may include means for accumulating, to an XOR buffer memory, combined parity data for a plurality of open blocks of non-volatile memory in response to write operations to the plurality of open blocks of non-volatile memory. In some embodiments, the system may further include means for determining to close one block of the plurality of open blocks of non-volatile memory and means for generating non-combined parity data for the one block based on the write operations to the plurality of open blocks of non-volatile memory.

In some embodiments, the system may further include means for selecting to perform one of generating the non-combined parity data for the one block of the plurality of open blocks of non-volatile memory by performing reversing XOR operations for a remainder of the plurality of open blocks of non-volatile memory and generating the non-combined parity data for the one block of the plurality of open blocks of non-volatile memory by performing additional XOR operations on the one block of the plurality of non-volatile memories to directly compute the non-combined parity data.

Corresponding structures for each of the means described above may include any of the structures shown in the drawings and described herein, such as for example, an XOR engine that may be implemented using a processor, logic gates, programmable logic, firmware, software or combinations thereof.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a controller for non-volatile memory of a memory device, the controller configured to:
   accumulate, in a memory buffer, combined parity data for a plurality of open blocks of non-volatile memory of the memory device in response to write operations for the plurality of open blocks of non-volatile memory;
   determine to close one block of the plurality of open blocks of non-volatile memory; and
   generate non-combined parity data for the one block based on the write operations to the plurality of open blocks of non-volatile memory.

2. The apparatus of claim 1, wherein the controller is configured to determine to close the one block in response to the one block being fully written except for a parity section.

3. The apparatus of claim 2, wherein the controller is configured to close the one block by writing the non-combined parity data to the parity section.

4. The apparatus of claim 1, wherein:
   the memory buffer is configured to accumulate a predetermined portion of parity data for at least one of the one block and remaining open blocks of the plurality of open blocks; and
   the controller is configured to:
   scan the plurality of open blocks to accumulate the combined parity data in the memory buffer as background operations to the write operations wherein a status of the scanning is indicated by scan complete pointers for each of the plurality of open blocks; and
   transfer the predetermined portion of the combined parity data from the memory buffer to a non-volatile memory.

5. The apparatus of claim 1, wherein the controller is configured to determine whether a written portion of the one block is less than a total of written portions of a remainder of the plurality of open blocks.

6. The apparatus of claim 5, wherein the controller is configured to determine whether the written portion of the one block is less than the total of the written portions of the remainder of the plurality of open blocks by determining whether a write pointer for the one block is less than a sum of write pointers for the remainder of the plurality of open blocks.

7. The apparatus of claim 5, wherein the controller is configured to generate the non-combined parity data for the one block by:
   storing a copy of the combined parity data to a non-volatile scratch memory in response to determining that the written portion of the one block is not less than the total of the written portions of the remainder of the plurality of open blocks; and
   performing reversing XOR operations on the combined parity data with data in the written portions of the remainder of the plurality of open blocks.

8. The apparatus of claim 7, wherein the controller is configured to remove from the combined parity data for the plurality of blocks, the non-combined parity data for the one block by performing XOR operations with the copy of the combined parity data and the non-combined parity data for the one block.

9. The apparatus of claim 5, wherein the controller is configured to generate the non-combined parity data for the one block by directly reperforming XOR operations on the written portion of the one block in response to determining that the written portion of the one block is less than the total of the written portions of the remainder of the plurality of open blocks.

10. A method comprising:
combining, in an XOR buffer memory, parity data for a plurality of open blocks of non-volatile memory in response to write operations to the plurality of open blocks of non-volatile memory;
selecting one block of the plurality of open blocks of non-volatile memory for closing in response to the one block being fully written except for a parity section;
extracting non-combined parity data for the one block from the combined parity data; and
storing the non-combined parity data in the parity section of the one block to close the one block.

11. The method of claim 10, further comprising accumulating a predetermined portion of parity data for at least one of the one block and the remaining open blocks.

12. The method of claim 11, further comprising scanning the plurality of open blocks to accumulate the combined parity data to the XOR buffer memory as background operations to the write operations wherein a status of the scanning is indicated by scan complete pointers for each of the plurality of open blocks.

13. The method of claim 12, further comprising transferring the predetermined portion of the combined parity data from the XOR buffer memory to a non-volatile memory.

14. The method of claim 10, further comprising determining whether a written portion of the one block is less than a total of written portions of a remainder of the plurality of open blocks.

15. The method of claim 14, further comprising determining whether the written portion of the one block is less than the total of the written portions of the remainder of the plurality of open blocks by determining whether a write pointer for the one block is less than a sum of write pointers for the remainder of the plurality of open blocks.

16. The method of claim 14, wherein generating the non-combined parity data for the one block comprises:
storing a copy of the combined parity data to a non-volatile scratch memory in response to determining that the written portion of the one block is not less than the total of the written portions of the remainder of the plurality of open blocks; and
performing reversing XOR operations on the combined parity data with data in the written portions of the remainder of the plurality of open blocks.

17. The method of claim 14, wherein generating the non-combined parity data for the one block comprises directly reperforming XOR operations on the written portion of the one block in response to determining that the written portion of the one block is less than the total of the written portions of the remainder of the plurality of open blocks.

18. The method of claim 14, further comprising removing from the combined parity data for the plurality of blocks, the non-combined parity data for the one block by performing XOR operations with a copy of the combined parity data and the non-combined parity data for the one block.

19. An apparatus comprising:
means for combining, in a single buffer, parity data for a plurality of open blocks of non-volatile memory in response to write operations for the plurality of open blocks of non-volatile memory;
means for generating non-combined parity data for one block of the plurality of open blocks using the combined parity data; and
means for closing the one block by writing the non-combined parity data to the one block.

20. The apparatus of claim 19 further comprising means for performing one of:
generating the non-combined parity data for the one block of the plurality of open blocks of non-volatile memory by performing reversing XOR operations for a remainder of the plurality of open blocks of non-volatile memory; and
generating the non-combined parity data for the one block of the plurality of open blocks of non-volatile memory by re-performing XOR operations on the one block of the plurality of non-volatile memories to directly compute the non-combined parity data.

* * * * *